United States Patent
Seo et al.

(10) Patent No.: US 9,733,565 B2
(45) Date of Patent: Aug. 15, 2017

(54) RESIN COMPOSITION, PRINTED CIRCUIT BOARD USING THE COMPOSITION, AND METHOD OF MANUFACTURING THE SAME

(71) Applicant: SAMSUNG ELECTRO-MECHANICS CO., LTD., Suwon (KR)

(72) Inventors: Young Kwan Seo, Suwon (KR); Jun Young Kim, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 460 days.

(21) Appl. No.: 14/445,771

(22) Filed: Jul. 29, 2014

(65) Prior Publication Data

US 2015/0050473 A1    Feb. 19, 2015

(30) Foreign Application Priority Data

Aug. 13, 2013 (KR) ........................ 10-2013-0095882

(51) Int. Cl.

| | |
|---|---|
| *G03F 7/085* | (2006.01) |
| *C07D 257/04* | (2006.01) |
| *H05K 3/38* | (2006.01) |
| *G03F 7/004* | (2006.01) |
| *G03F 7/027* | (2006.01) |
| *G03F 7/029* | (2006.01) |
| *G03F 7/031* | (2006.01) |
| *G03F 7/038* | (2006.01) |
| *H05K 3/00* | (2006.01) |
| *H05K 1/03* | (2006.01) |

(52) U.S. Cl.
CPC ............ *G03F 7/085* (2013.01); *G03F 7/0047* (2013.01); *G03F 7/027* (2013.01); *G03F 7/029* (2013.01); *G03F 7/031* (2013.01); *G03F 7/038* (2013.01); *H05K 3/38* (2013.01); *H05K 1/0346* (2013.01); *H05K 1/0373* (2013.01); *H05K 3/0023* (2013.01); *H05K 2201/0158* (2013.01); *H05K 2201/0209* (2013.01); *H05K 2201/0227* (2013.01); *H05K 2203/0514* (2013.01); *Y10T 428/24802* (2015.01); *Y10T 428/24917* (2015.01)

(58) Field of Classification Search
CPC .............................. G03F 7/085; C07D 257/04
See application file for complete search history.

(56) References Cited

U.S. PATENT DOCUMENTS

| | | | |
|---|---|---|---|
| 4,322,459 A | 3/1982 | Castellucci et al. | |
| 8,900,697 B2 * | 12/2014 | Seo .................. | C08K 9/04 428/297.4 |
| 2005/0247237 A1* | 11/2005 | Schukat .............. | B82Y 30/00 106/472 |
| 2007/0043098 A1* | 2/2007 | Sedelmeier .......... | C07D 257/04 514/381 |
| 2013/0209760 A1* | 8/2013 | Seo .................. | B32B 3/10 428/209 |
| 2014/0187677 A1* | 7/2014 | Seo .................. | C08K 9/04 523/453 |
| 2015/0050585 A1* | 2/2015 | Seo .................. | G03F 7/0045 430/18 |

FOREIGN PATENT DOCUMENTS

EP    0 665 468 A1    8/1995

\* cited by examiner

*Primary Examiner* — Liam J Heincer
(74) *Attorney, Agent, or Firm* — NSIP Law (57) ABSTRACT

A resin composition, a printed circuit board using the composition, and a method of manufacturing the printed circuit board. The resin composition includes: a photopolymerizable compound, such as one having an ethylenically unsaturated bond which is polymerizable in a molecule, a photoinitiator, and a surface-modified silica by an alkyl sulfonated tetrazole compound.

24 Claims, 2 Drawing Sheets

RESIN COMPOSITION, PRINTED CIRCUIT BOARD USING THE COMPOSITION, AND METHOD OF MANUFACTURING THE SAME

CROSS-REFERENCE TO RELATED APPLICATIONS

This application claims the foreign priority benefit of Korean Patent Application No. 10-2013-0095882, filed on Aug. 13, 2013, in the Korean Intellectual Property Office and entitled "Resin Composition, Printed Circuit Board Using the Composition, and Preparing Method Thereof", which is hereby incorporated by reference in its entirety into this application.

BACKGROUND

1. Field

Embodiments of the present invention relate to a resin composition, a printed circuit board using the composition, and a method of manufacturing the same.

2. Description of the Related Art

In general, in order to reinforce adhesion or close adhesion between a resin and a metal in electronic products such as printed circuit boards and the like, one method is to form roughness on the resin surface through a desmear process. Another method is to add additives that increase cohesion (or adhesion) to the resin. In the present disclosure, the terms "cohesion", "close adhesion", or "adhesion," when used to describe a resin, have the same or similar meaning as the resin's bonding strength with a metal.

When forming the aforementioned roughness on the resin surface, a low roughness is required due to a decreased width of the wire. As a result, the adhesion or close adhesion reinforcing effects obtained by the low roughness also decreases. Accordingly, the role of an additive to be added to the resin for reinforcing adhesion is important. European Patent Publication No. EP 0,665,468 discloses a triazole-based or tetrazole-based compositions as an additive for reinforcing adhesion with metal.

In order to maximize the adhesion reinforcing effect of the resin, the additive for reinforcing the adhesion should be uniformly distributed in the resin. In order to uniformly distribute the additive for reinforcing the adhesion in the resin, the additive is dissolved into a solvent or is added as a powder and then distributing the added powder. However, these methods have problems in terms of compatibility between the solvent and the resin and also in terms of the stability of the powder. In addition, U.S. Pat. No. 4,322,459 discloses an epoxy resin having improved curing property by introducing azole such as triazole or tetrazole into the epoxy resin, but fails to recognize adhesion improvement.

In forming a via hole according to the related art, the via hole is implemented through a laser drill or a drill tip process after curing an epoxy resin composition which is an interlayer insulating film to form a cured film. However, the number of via holes needed in printed circuit boards may be over several tens to several tens of thousands per panel. Thus, when applying the above-described method, a great amount of equipment and time is required.

SUMMARY

One aspect of the invention is to provide a negative type photosensitive resin composition capable of performing an alkali development process.

Another aspect is to provide an insulating film in which heat-resistance and mechanical properties are maintained, a via hole is formed by exposure and development processes, and adhesion with a metal is excellent, using the resin composition.

A further aspect is to provide a printed circuit board including an insulating layer containing the resin composition.

In addition, the present invention has been made in an effort to provide a method of manufacturing the printed circuit board by using the resin composition.

According to an embodiment of the present invention, a resin composition includes: a photopolymerizable compound having an ethylenically unsaturated bond which is polymerizable in a molecule; a photoinitiator; and a silica surface-functionalized by an alkyl sulfonated tetrazole compound represented by the following Chemical Formula 1:

[Chemical Formula 1]

wherein $R_1$ is selected from a C1-C20 aliphatic or alicyclic alkyl group, a C1-C20 aryl group or aralkyl group, an alkyl group or an aryl group substituted with a C1-C20 functional group, a ring linked by alkylene with or without a heteroatom, or a polymer compound group and derivatives thereof, and n is an integer of 1 to 6. The C1-C20 aryl group or aralkyl group may be a C6-C20 aryl group or aralkyl group.

The photopolymerizable compound may be an acid-modified epoxy acrylate resin.

The acid-modified epoxy acrylate resin may be selected from a group consisting of a cresol novolac type acid-modified epoxy acrylate resin, a biphenyl type acid-modified epoxy acrylate resin, a bisphenol A type acid-modified epoxy acrylate resin, a bisphenol F type acid-modified epoxy acrylate resin, a phenol novolac type acid-modified epoxy acrylate resin, a triphenolmethane-type acid-modified epoxy acrylate resin, an urethane acrylic acid-modified epoxy acrylate resin, and combinations thereof.

The acid-modified epoxy acrylate resin may have an acid value of about 10 mg KOH/g to about 200 mg KOH/g.

The photoinitiator may be selected from a group consisting of chloroacetophenone, diethoxy acetophenone, hydroxy acetophenone, α-amino acetophenone, benzoin ether, benzyl dimethyl ketal, benzo phenone, thioxantone, anthraquinone, and combinations thereof.

The silica may have an average particle size of about 0.05 μm to about 5 μm.

The resin composition may further include an epoxy resin, an acrylate resin, and a curing agent.

The epoxy resin may be selected from a group consisting of a bisphenol A type epoxy resin, a bisphenol F type epoxy resin, a bisphenol S type epoxy resin, a phenol novolac type epoxy resin, a cresol novolac type epoxy resin, an alkylphenol novolac type epoxy resin, a biphenyl type epoxy resin, an aralkyl type epoxy resin, a dicyclopentadiene type epoxy resin, a naphthalene type epoxy resin, a naphthol type epoxy resin, a biphenyl aralkyl type epoxy resin, a fluorene type epoxy resin, a xanthene type epoxy resin, a rubber modified type epoxy resin, a phosphorus-based epoxy resin, and combinations thereof.

The acrylate resin may be selected from a group consisting of EO- or PO-modified(meth)acrylate, triethylene glycol diacrylate, neopentyl glycol diacrylate, 1,6-hexanediol diacrylate, 3-methyl-1,5-pentanediol diacrylate, 2-butyl-2-ethyl-1,3-propanediol diacrylate, 1,9-nonanediol diacrylate, polyethylene glycol diacrylate, 2-hydroxyethyl methacrylate (HEMA), 2-hydroxypropyl methacrylate, 2-hydroxy acrylate, 2-hydroxypropyl acrylate, 2-hydroxybutyl methacrylate, phenyl glycidyl ester acrylate, 1,6-hexanediol epoxy acrylate, glycidyl(meth)acrylate, pentaerythritol tri(meth)acrylate, pentaerythritol tetra(meth)acrylate, ethylene glycol di(meth)acrylate, polyethylene glycol di(meth)acrylate, and combinations thereof.

The curing agent may be selected from a group consisting of an amide-based curing agent, a polyamine-based curing agent, an acid anhydride curing agent, a phenol novolac-type curing agent, polymercaptan curing agent, a tertiary amine curing agent, an imidazole curing agent, a peroxide curing agent, and combinations thereof.

The resin composition may include the photopolymerizable compound in a content of about 10 wt % to about 90 wt %, the photoinitiator in a content of about 0.1 wt % to about 3 wt %, and the silica in a content of about 7 wt % to about 87 wt %.

The resin composition may include the epoxy resin at a content of about 1 wt % to about 60 wt %, the acrylate resin in a content of about 1 wt % to about 20 wt %, and the curing agent in a content of about 0.1 wt % to about 3 wt %.

According to another embodiment of the present invention, there is provided an insulating film containing the resin composition as described above.

According to another embodiment of the present invention, there is provided a printed circuit board including an insulating film containing the resin composition as described above.

According to another embodiment of the present invention, there is provided a method of manufacturing a printed circuit board, the method including: laminating the resin composition as described above on a substrate to form an insulating layer; and forming a via hole in the insulating layer through exposure and development processes.

The development process may be performed by using an alkali development solution.

The via hole may be formed by removing a portion of the insulating layer that is not exposed, by the development process.

The forming of the insulating layer may be performed by coating the resin composition as described above on the substrate.

The forming of the insulating layer may be performed by laminating an insulating film containing the resin composition as described above on the substrate.

The method may further include, after the forming of the via hole, forming a circuit layer including a via in the insulating layer.

According to another aspect of the present invention, a resin composition includes: a photopolymerizable compound; a photoinitiator; and a silica surface-functionalized with an alkyl sulfonated tetrazole compound represented by the aforementioned Chemical Formula 1. In a further aspect, a resin may be formed by photopolymerization of this resin composition, and a printed circuit board may comprise an insulating film containing the resin. In another further aspect of the invention, the printed circuit board may include a substrate on which the insulating film is formed, and a metal conductor layer formed on and in contact with the insulating film.

Additional aspects and/or advantages will be set forth in part in the description which follows and, in part, will be apparent from the description, or may be learned by practice of the invention.

BRIEF DESCRIPTION OF THE DRAWINGS

The above aspects, features and advantages of embodiments of the present invention will be more clearly understood from the following detailed description taken in conjunction with the accompanying drawings, in which.

DESCRIPTION OF EMBODIMENTS

Aspects of embodiments of the invention, including features and advantages, will be more clearly understood from the following exemplary embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, embodiments of the present invention will be described in detail with reference to the attached drawings.

Resin Composition

A resin composition according to the present invention includes a photopolymerizable compound having an ethylenically unsaturated bond which is polymerizable in a molecule, a photoinitiator, and a surface-modified silica that is surface-functionalized with an alkyl sulfonated tetrazole compound present on the silica. The alkyl sulfonated tetrazole compound is represented by the following Chemical Formula 1:

[Chemical Formula 1]

wherein, $R_1$ is selected from a C1-C20 aliphatic or alicyclic alkyl group, a C1-C20 aryl group or aralkyl group, an alkyl group or an aryl group substituted with a C1-C20 functional group, a ring linked by alkylene with or without a heteroatom, or a polymer compound group and derivatives thereof, and n is an integer of 1 to 6. The C1-C20 aryl group or aralkyl group may be a C6-C20 aryl group or aralkyl group.

The photopolymerizable compound used in embodiments of the present invention may be an acid-modified epoxy acrylate resin.

The acid-modified epoxy acrylate resin indicates a resin prepared by reacting an epoxy resin having one or more epoxy groups included in a molecule, or two or more epoxy groups included in a molecule, or four or more epoxy groups included in a molecule with an acrylic acid to introduce a photocured part thereinto, and then reacting the reactant with an acid anhydride, to perform an alkali development process.

As the acid-modified epoxy acrylate resin, a cresol novolac type acid-modified epoxy acrylate resin, a biphenyl type acid-modified epoxy acrylate resin, a bisphenol A type acid-modified epoxy acrylate resin, a bisphenol F type acid-modified epoxy acrylate resin, a phenol novolac type acid-modified epoxy acrylate resin, a triphenolmethane-type acid-modified epoxy acrylate resin, an urethane acrylic acid-modified epoxy acrylate resin, and combinations thereof may be used, but the present invention is not particularly limited thereto.

In addition, the acid-modified epoxy acrylate resin may have an acid value of about 10 mg KOH/g to about 200 mg KOH/g, or about 50 mg KOH/g to about 150 mg KOH/g. In the case in which the acid value is less than 10, alkali development performance may be deteriorated. In the case in which the acid value is more than 200, it is difficult to control a development rate, such that a remaining rate may be deteriorated.

A content of the photopolymerizable compound based on the resin composition may be about 10 wt % to about 90 wt %, or about 20 wt % to about 80 wt %. In the case in which the content thereof is less than 10 wt %, alkali development performance may be deteriorated. In the case in which the content thereof is more than 90 wt %, physical, mechanical, and chemical properties may be deteriorated.

As the photoinitiator, chloroacetophenone, diethoxy acetophenone, hydroxy acetophenone, α-amino acetophenone, benzoin ether, benzyl dimethyl ketal, benzo phenone, thioxantone, anthraquinone and combinations thereof may be used, but the present disclosure is not particularly limited thereto.

The photoinitiator may be at least one selected from photoinitiators absorbable at wavelength of 365 nm or 405 nm among exemplified compounds, but the present invention is not particularly limited thereto.

A content of the photoinitiator may be about 0.1 wt % to about 3 wt % based on the resin composition. In the case in which the content thereof is less than 0.1 wt %, a photoreactivity is decreased and a remaining rate is also decreased, such that forming a via hole by a developing process may not be achieved, and in the case in which the content thereof is more than 3 wt %, it may be difficult to form a via hole due to decrease in a development performance difference between an exposure part and a non-exposure part.

The surface-functionalized silica may decrease a coefficient of thermal expansion (CTE) of a photosensitive resin and increase adhesion with a metal. The content of the silica does not need to be specifically defined depending on properties to be required in consideration of usage, and the like, of the resin composition, but may be in a range of about 7% to about 87 wt % in the resin composition. In the case in which the content is less than 7 wt %, a dielectric tangent may be low and a thermal expansion rate may be increased, and in the case in which the content is more than 87 wt %, adhesion strength may be deteriorated and the film may be difficult to be formed.

In the embodiment of the present invention, in the case in which the content of the silica is increased in order to decrease CTE of the insulating resin, the surface-functionalized silica according to the embodiment of the present invention may be more effective than the case of implementing the insulating resin having low roughness (Ra<about 0.3 μm).

Meanwhile, the alkyl sulfonated tetrazole compound represented by the following Chemical Formula 1 may be designed in a structure in which the —S— group donates electrons as many as required for adhesion by alkylsulfonating tetrazole represented by the following Chemical Formula 2 to be alkylsulfone represented by the following Chemical Formula 3 to thereby introduce an alkyl group having an appropriate size:

[Chemical Formula 2]

[Chemical Formula 3]

wherein $R_1$ and n are the same as described in Chemical Formula 1 above.

According to the embodiment of the present invention, the alkyl sulfonated tetrazole compound represented by Chemical Formula 1 may be prepared according to a method represented by the following Reaction Formula 1, wherein the preparation method is generally performed in the presence of solvent. A reaction molar ratio of tetrazole represented by Chemical Formula 2 above to alkyl sulfone represented by Chemical Formula 3 above may be 1:0.5 to 1.5 in view of stoichiometry.

[Reaction Formula 1]

n = 1~6

In Reaction Formula 1, $R_1$ and n are the same as described in Chemical Formula 1 above.

As the alkyl sulfonated tetrazole compound, 3-(1-methyl-1H-tetrazole-5-ylthio)propane-1-sulfonic acid, 3-(1-methyl-1H-tetrazole-5-ylthio)butane-1-sulfonic acid, or the like, may be used in consideration of adhesion in the final resin, but the present invention is not particularly limited thereto.

Meanwhile, the silica surface-functionalized by the alkyl sulfonated tetrazole compound represented by Chemical Formula 1 above may be prepared according to the following Reaction Formula 2, as an example.

More specifically, silica and sodium ethoxide are reacted, and then the reactant and the alkyl sulfonated tetrazole compound represented by Chemical Formula 1 above are reacted.

[Reaction Formula 2]

An average particle size of the silica is not particularly limited, but may be 0.05 μm to 5 μm according to the recent miniaturization trend of electronic components such as a printed circuit board, and the like.

The reaction between the silica and the sodium ethoxide is not particularly limited, but the silica and the sodium ethoxide may be mixed in a weight ratio of 1 to 10:1 and reacted at a temperature of about 20° C. to about 60° C. in consideration of reaction efficiency and economical efficiency. The reaction between the reactant obtained by reacting the silica and the sodium ethoxide and the alkyl sulfonated tetrazole compound is not particularly limited, but the reactant and the alkyl sulfonated tetrazole compound may be mixed in a weight ratio of 1 to 10:1 and reacted at a temperature of about 20° C. to about 40° C. in consideration of reaction efficiency and economical efficiency. That is, in the case in which the added amount of the alkyl sulfonated tetrazole compound is small, the silica may not be sufficiently surface-functionalized, and in the case in which the added amount of the alkyl sulfonated tetrazole compound is large, a purification time may be increased.

In addition, the resin composition may further include an epoxy resin, an acrylate resin, and a curing agent.

The epoxy resin may be added in order to increase handability as an adhesion film of the resin composition after being dried.

As the epoxy resin, a bisphenol A type epoxy resin, a bisphenol F type epoxy resin, a bisphenol S type epoxy resin, a phenol novolac type epoxy resin, a cresol novolac type epoxy resin, an alkylphenol novolac type epoxy resin, a biphenyl type epoxy resin, an aralkyl type epoxy resin, a dicyclopentadiene type epoxy resin, a naphthalene type epoxy resin, a naphthol type epoxy resin, a biphenyl aralkyl type epoxy resin, a fluorene type epoxy resin, a xanthene type epoxy resin, a rubber modified type epoxy resin, a phosphorus-based epoxy resin, and combinations thereof may be used, but the present invention is not particularly limited thereto.

The epoxy resin may have a content of about 1 wt % to about 60 wt %, or about 10 wt % to about 50 wt % based on the resin composition. In the case in which the content of the epoxy resin is less than 1 wt %, physical property, mechanical property, and chemical property may be deteriorated, and in the case in which the content of the epoxy resin is more than 60 wt %, the alkali development performance may be weaken, such that it may be difficult to form a via hole.

As the acrylate resin, EO- or PO-modified(meth)acrylate, triethylene glycol diacrylate, neopentyl glycol diacrylate, 1,6-hexanediol diacrylate, 3-methyl-1,5-pentanediol diacrylate, 2-butyl-2-ethyl-1,3-propanediol diacrylate, 1,9-nonanediol diacrylate, polyethylene glycol diacrylate, 2-hydroxyethyl methacrylate (HEMA), 2-hydroxypropyl methacrylate, 2-hydroxy acrylate, 2-hydroxypropyl acrylate, 2-hydroxybutyl methacrylate, phenyl glycidyl ester acrylate, 1,6-hexanediol epoxy acrylate, glycidyl(meth)acrylate, pentaerythritol tri(meth)acrylate, pentaerythritol tetra(meth)acrylate, ethylene glycol di(meth)acrylate, polyethylene glycol di(meth)acrylate, and combinations thereof may be used, but the present invention is not particularly limited thereto.

The acrylate resin may have a content of about 1 wt % to about 20 wt % or about 1 wt % to about 10 wt % based on the resin composition. In the case in which the content of the epoxy resin is less than 1 wt %, physical property, mechanical property, and chemical property may be deteriorated, and in the case in which the content of the epoxy resin is more than 20 wt %, the alkali development performance may be weaken.

The resin composition according to the embodiment of the present invention may selectively contain the curing agent for efficiency in the process.

As the curing agent, an amide-based curing agent, a polyamine-based curing agent, an acid anhydride curing agent, a phenol novolac-type curing agent, polymercaptan curing agent, a tertiary amine curing agent, or an imidazole curing agent, a peroxide curing agent, and combinations thereof may be used, but the present invention is not particularly limited thereto.

The curing agent may have a content of about 0.1 wt % to about 3 wt % based on the resin composition. In the case in which the content is less than 0.1 wt %, a high temperature curing may not be sufficiently achieved or a curing speed may be deteriorated. In the case in which the content is more than 3 wt %, the curing speed is extremely fast, such that it is difficult to be applied in the process or a storage stability is deteriorated, and after the reaction, a non-reacted curing agent exists, thereby increasing an absorption rate of an insulating film or a prepreg to deteriorate electrical property.

According to the embodiment of the present invention, any other inorganic filler in addition to the inorganic filler such as the surface-treated silica described above may be further included in the resin composition. In addition, as specific examples of the inorganic filler, silica, alumina, barium sulfate, talc, clay, mica powder, aluminum hydroxide, magnesium hydroxide, calcium carbonate, magnesium carbonate, magnesium oxide, boron nitride, aluminum borate, barium titanate, calcium titanate, magnesium titanate, bismuth titanate, titanium oxide, barium zirconate, or calcium zirconate may be used alone or two kinds or more thereof may be combined with each other. In particular, the silica having a low dielectric tangent is preferred.

In addition, in the case in which the inorganic filler has an average particle size more than about 5 μm, since it is difficult to stably form a fine pattern when a circuit pattern is formed in a conductor layer, the average particle size may be about 5 μm or less. Further, the inorganic filler may be surface-treated by surface treating agents such as a silane coupling agent, and the like, in order to improve moisture-resistance. In addition, the silica having a diameter of about 0.05 μm to about 2 μm may be used.

The resin composition according to the embodiment of the present invention may be effectively cured by selectively containing a curing accelerator therein. Examples of the curing accelerator used in the embodiment of the present invention may include a metal-based curing accelerator, an imidazole-based curing accelerator and an amine-based curing accelerator, and one kind or a combination of two or more kinds of a curing accelerator may be added to the resin composition in an amount generally used in the art.

Examples of the metal-based curing accelerator may include an organic metal complex or an organic metal salt of a metal such as cobalt, copper, zinc, iron, nickel, manganese, tin, or the like, but the present invention is not particularly limited thereto. Specific examples of the organic metal complexes may include organic cobalt complex such as cobalt (II) acetylacetonate, cobalt (III) acetylacetonate, or the like, organic copper complex such as copper (II) acetylacetonate, organic zinc complex such as zinc (II) acetylacetonate, organic iron complex such as iron (III) acetylacetonate, organic nickel complex such as Ni (II) acetylacetonate, organic manganese complex such as manganese (II) acetylacetonate, and the like. Examples of the organic metal salt may include zinc octyl acid, tin octyl acid, zinc naphthenic acid, cobalt naphthenic acid, tin stearic acid, zinc stearic acid, and the like. As the metal-based curing accelerator, cobalt (II) acetylacetonate, cobalt (III) acetylacetonate, zinc (II) acetylacetonate, zinc naphthenic acid and iron (III) acetylacetonate may be used, and in particular, cobalt (II) acetylacetonate and zinc naphthenic acid may be used, in view of curability and solvent solubility. One kind or a combination of two or more kinds of the metal-based curing accelerator may be used.

Examples of the imidazone-based curing accelerator may include imidazole compounds such as 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazoliumtrimellitate, 1-cyanoethyl-2-phenylimidazoliumtrimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazineisocyanic acid adduct, 2-phenyl-imidazoleisocyanic acid adduct, 2-phenyl-4,5-dihydroxymethylimidazole, 2-phenyl-4-methyl-5-hydroxymethylimidazole, 2,3-dihydroxy-1H-pyroro[1,2-a]benzimidazole, 1-dodecyl-2-methyl-3-benzyl-imidazoliumchloride, 2-methylimidazoline, and 2-phenyl-imidazoline, and an adduct of the imidazole compounds and the epoxy resin. One kind or a combination of two or more kinds of the imidazole-based curing accelerator may be used.

Examples of the amine-based curing accelerator may include trialkylamine such as triethylamine and tributylamine, and an amine compound such as 4-dimethylaminopyridine, benzyldimethylamine, 2,4,6-tris(dimethylaminomethyl)phenol, 1,8-diazabicyclo(5,4,0)-undecene. One kind or a combination of two or more kinds of amine-based curing accelerator may be used.

The resin composition according to the embodiment of the present invention may be mixed in the presence of organic solvent. As the organic solvent, 2-methoxy ethanol, acetone, methyl ethyl ketone, cyclohexanone, ethyl acetate, butyl acetate, cellosolve acetate, propylene glycol monomethyl ether acetate, ethylene glycol monobutyl ether acetate, cellosolve, butyl cellosolve, carbitol, butyl carbitol, xylene, dimethylformamide, and dimethylacetamide may be used in consideration of solubility and compatibility of the resin and other additives used in the embodiment of the present invention, but the present invention is not particularly limited thereto.

The above-described resin composition of the present invention, which is the negative type photosensitive resin composition capable of developing the organic solvent, includes the silica surface-functionalized by the alkyl sulfonated tetrazole compound represented by Chemical Formula 1 above, such that at the time of using the insulating film or the insulating layer of a substrate, heat-resistance property, and mechanical property may be improved, and adhesion with the metal may be increased.

Insulating Film

An insulating film according to the embodiment of the present invention includes the above-described resin composition.

The insulating film may have a low coefficient of thermal expansion of 50 ppm/° C. or less, and may be used as the insulating layer at the time of manufacturing a multilayer printed board.

The insulating film may be manufactured by methods described below, but is not particularly limited thereto and any methods known in the art may be used.

According to the embodiment of the present invention, the above-described resin composition was used to manufacture the film using a roll coater or a curtain coater and a drying process was performed. In addition, a solution layer of the above-described resin composition may be formed on a substrate by a solvent casting method and the like, and the solvent may be removed from the solution layer, such that the film may be manufactured on the substrate. As the substrate, metal foils such as a copper foil, an aluminum foil, a gold foil, and a silver foil or a glass substrate, a polyethylene terephthalate (PET) film may be used.

According to another embodiment of the present invention, the above-described resin composition is applied or impregnated into a reinforcing material, followed by curing and drying to remove the solvent, thereby preparing a prepreg to be used.

Examples of the impregnation method may include a dip coating method, a roll coating method, and the like.

Examples of the reinforcing material may include a woven glass fiber (glass cloth), a woven alumina glass fiber, a glass fiber non-woven, a cellulose nonwoven fabric, a woven carbon fiber, a polymer fabric, and the like. In addition, the reinforcing material may be a glass fiber, a silica glass fiber, a carbon fiber, an alumina fiber, a silicon carbide fiber, asbestos, rock wool, mineral wool, gypsum whisker, a woven fabric or nonwoven fabric thereof, an aromatic polyamide fiber, a polyimide fiber, liquid crystal polyester, a polyester fiber, a fluorine fiber, a polybenzoxazol fiber, a glass fiber with a polyamide fiber, a glass fiber with a carbon fiber, a glass fiber with a polyimide fiber, a glass fiber with aromatic polyester, a glass paper, a mica paper, an alumina paper, a kraft paper, a cotton paper, paper-glass bound paper, and the like. At least one reinforcing material described above may be mixed to be used.

Here, the glass fiber may have a thickness of 5 μm to 200 μm.

In addition, the resin composition may be impregnated in a content of about 0.4 to about 3 parts by weight based on 1 part by weight of the reinforcing material. In the case of being impregnated in the above-described range, at the time of using two or more prepregs, the prepreg has excellent close adhesion therebetween and excellent mechanical strength and dimensional stability.

The curing process may be performed at a temperature of about 150° C. to about 350° C., and heat-treatment may be performed even at a low temperature as described above, such that the resin composition may be applied to the printed circuit board.

The prepreg may be bound to copper. That is, the prepreg may be bound to copper by impregnating the resin composition according to the embodiment of the present invention into the reinforcing material, positioning the prepreg obtained by performing a heat treatment process in a semi-curing state on the copper foil, and performing the heat treatment. In the case of removing the solvent and performing the heat treatment, a member in which copper and the prepreg are bound to each other is manufactured. In order to evaporate the solvent, a heating method under reduced pressure, or a ventilation method may be used. Examples of a coating method may include a roller coating method, a dip coating method, a spray coating method, a spin coating method, a curtain coating method, a slit coating method, a screen printing method, and the like.

With the insulating film including the above-described resin composition as described above, the heat-resistance property and the mechanical property may be excellent, the via hole may be formed by the exposure and development processes, and the adhesion with the metal may be excellent.

Printed Circuit Board

The printed circuit board according to the embodiment of the present invention includes an insulating layer containing the above-described resin composition.

According to the embodiment of the present invention, the above-described insulating film itself as the insulating layer may be applied on the substrate at the time of manufacturing the printed circuit board.

According to another embodiment of the present invention, the above-described resin composition may be directly coated on the substrate to form the insulating layer. The coating method is not particularly limited and any coating methods known in the art may be used.

The substrate may be the printed circuit board generally having at least one circuit layer.

With the printed circuit board including the insulating layer containing the resin composition according to the embodiment of the present invention, the adhesion property, the heat-resistance property, and the mechanical property may be maintained to have excellent reliability, and the via hole may be formed by the exposure and development processes.

Method of Manufacturing Printed Circuit Board

FIGS. 1 through 4 are cross sectional views schematically showing a method of manufacturing a printed circuit board according to an embodiment of the present invention.

Hereinafter, the method of manufacturing the printed circuit board according to the embodiment of the present invention will be described with reference to FIGS. 1 through 4.

Figure 1:
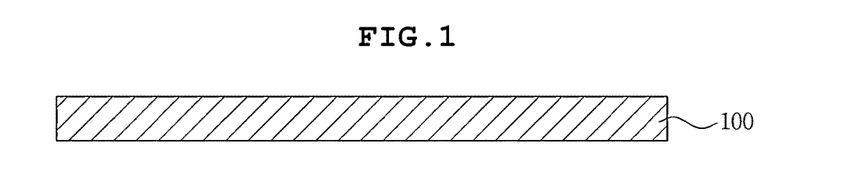
FIGS. 1 through 4 are cross sectional views schematically showing a method of manufacturing a printed circuit board according to an embodiment of the present invention.

First, referring to FIG. 1, a substrate 100 is prepared.

The substrate 100 may be a printed circuit board as a circuit board having at least one layer circuit formed in a dielectric layer. A specific inner layer circuit constitution is not shown in the drawing for convenience of explanation, but a person skilled in the art may sufficiently appreciate that a general circuit board having at least one layer circuit formed in the dielectric layer may be applied as the substrate 100.

As the dielectric layer, a resin insulating layer may be used. As materials of the resin insulating layer, a thermosetting resin such as an epoxy resin, a thermoplastic resin such as a polyimide resin, a resin having a reinforcement material such as a glass fiber or an inorganic filler impregnated therein, for example, a prepreg may be used. In addition, a thermosetting resin, a photosetting resin, and the like, may be used. In addition, the above-described insulating film may be applied as the dielectric layer, but the present invention is not particularly limited thereto.

The circuit may be made of any material used as a conductive metal for a circuit in a circuit substrate field without limitation, and is typically made of copper in the case of a printed circuit board.

Figure 2:
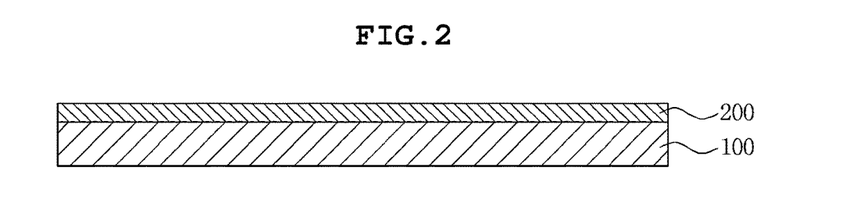

Next, referring to FIG. 2, the above-described resin composition is laminated on the substrate 100 to form the insulating layer 200.

According to the embodiment of the present invention, the insulating layer 200 may be formed by directly coating the above-described resin composition on the substrate.

According to another embodiment of the present invention, the insulating layer 200 may be formed by laminating the insulating film including the above-described resin composition on the substrate.

More specifically, the insulating film may be used by manufacturing the above-described resin composition as the film using the roll coater or the curtain coater and then performing the drying process, or may be used by forming a solution layer of the above-described resin composition on the substrate using the solvent casting method, removing the solvent from the solution layer, and manufacturing the film on the board, or coating or impregnating the above-described resin composition into the reinforcing material, followed by curing and drying to remove the solvent, thereby preparing a prepreg as described above. Examples of the impregnation method may include a dip coating method, a roll coating method, and the like. Detailed description of the prepreg is the same as that of the insulating film described above.

Figure 3:
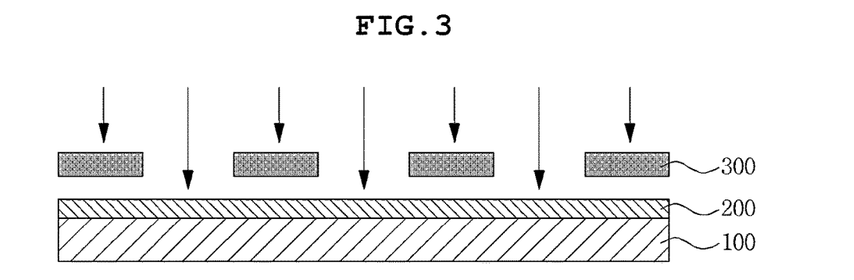

Next, referring to FIG. 3, a predetermined region in the insulating layer 200 is exposed by an exposure process using a mask 300.

Here, according to the embodiment of the present invention, UV wavelength of the exposure process is not particularly limited, but may be 350 nm to 450 nm.

Figure 4:
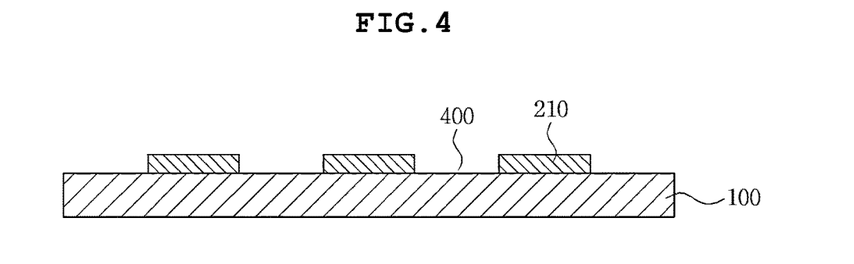

Next, referring to FIG. 4, the insulating layer 200 is patterned by the development process, such that the patterned insulating layer 210 and the via hole 400 are formed.

The development process may be performed by using a general organic solvent development solution such as methylethylketone alone, or a mixed inorganic solvent or an organic solvent mixed with water.

As the alkali development solution, inorganic alkaline aqueous solutions such as sodium hydroxide, potassium hydroxide, sodium carbonate, sodium silicate, sodium metasilicate, and the like, primary amines such as ethylamine, n-propylamine, and the like, secondary amines such as diethyl amine, dibutyl amine, and the like, tertiary amines such as triethyl amine, methyl diethyl amine, and the like, alcohol amines such as dimethyl ethanol amine, triethanolamine, and the like, quaternary ammonium salts such as tetramethylammonium hydroxide, tetraethylammonium hydroxide, and the like, cyclic amines such as pyrrole and piperidine, and the like, may be used.

Meanwhile, the development process may be performed by using a method of spraying the development solution on the substrate, immersing and shaking the development solution on the substrate, or immersing the development solution on the substrate and performing an ultrasonic treatment, but any methods known in the art may be used and are not particularly limited thereto.

The via hole 400 may be formed by removing a portion of the insulating layer 200 that is not exposed, by masking due to a mask 300 from the development process.

In addition, drying the developed substrate and performing a heat-treatment and a post curing process may be included. The solvent remained in the developed substrate may be removed by drying, and followed by the post curing process at a high temperature, thereby increasing a curing density of the insulating layer.

Meanwhile, although not shown, according to the general method of forming the circuit layer known in the art, after the via hole is formed, forming the circuit layer including the via in the patterned insulating layer may be further included.

With the method of manufacturing the printed circuit board according to the embodiment of the present invention, the via hole may be formed by the exposure and development processes, such that the manufacturing process may be simple and the cost thereof may be reduced as compared to the existing technology.

Hereinafter, although the present invention will be described in detail with reference to the following Examples, the scope of the invention should not be limited to the embodiments set forth herein.

Preparation Example 1

Synthesis of 3-(1-methyl-1H-tetrazole-5-ylthio)propane-1-sulfonic acid

Acetonitrile of 90 g, 5-mercapto-1-methyltetrazole of 20 g (0.172 mol), and 1,3-propanesultone of 21 g (0.172 mol) were weighed, respectively, put into a 250 ml 1-neck flask having a reflux condenser mounted therein, and refluxed under nitrogen atmosphere at about 80° C. After an end point of the reaction was determined by a thin layer chromatography (TLC) (a development solvent chloroform:methanol=10:1) analysis and the reaction was terminated, Celite 545 was used to filter the reactant and filtrate was reduced-pressure concentrated, thereby obtaining 3-(1-methyl-1H-tetrazole-5-ylthio)propane-1-sulfonic acid using a silica column chromatography. A synthesis yield was 68%, and a melting point (DSC) was 98° C.

$^1$H-NMR (CDCl3, δ) 3.63 (s, 3H, tetrazole-CH$_3$), 3.40 (t, 2H, —S—CH$_2$CH$_2$CH$_2$—SO$_3$—) 2.95 (t, 2H, —S—CH$_2$CH$_2$CH$_3$—SO$_3$—), 2.20 (m, 2H, —S—CH$_2$CH$_2$CH$_3$—SO$_3$—)

Preparation Example 2

Preparation of Surface-Functionalized Silica

UFP30 (Denka Co., Ltd.) fused silica was dried in a dry oven at 120° C. for 3 or more hours, and then cooled up to room temperature in a desiccator to thereby remove moisture adsorbed in the silica. The moisture-removed silica of 50 g and dichloromethane of 500 g were put into a 1 liter flask and ultrasonic oscillation was used to disperse the silica well. After sodium ethoxide of 10 g was put thereinto, followed by stirring at a temperature of 40° C. for 2 hours, a silica powder was filtered by using a filter paper. After dichloromethane of 200 g and 3-(1-methyle-1H-tetrazole-5-ylthio)propane-1-sulfonic acid of 10 g obtained by Preparation Example 1 were put into the filtered silica powder, followed by stirring at room temperature for 5 hours, distilled water of 200 g was put thereto using a fractional funnel, thereby extracting sodium hydroxide as a reaction product. After the extraction was additionally repeated twice, the silica and dichloromethane were separated from each other by centrifugation at 3000 rpm for 10 minutes using a centrifuge, followed by drying in a dry oven at 80° C., thereby obtaining a surface-functionalized silica of 35 g. As a result of the silica obtained as described above by spectroscopic analysis, the presence of the following sulfone group was confirmed.

IR (KBr) (v, cm$^{-1}$); 1350, 1170 (Si—SO$^{3-}$—R), 715 (R—S—R), 1480, 1350, 1300, 1050 (tetrazole ring)

Example 1

After cresol novolac type acid-modified epoxy acrylate resin CCR-1171H (manufactured by Nippon Kayaku Co., Ltd.) of 92 g and Disper BYK-110 (manufactured by BYK Company) of 4.5 g were dissolved into methyl ethyl ketone (MEK) of 115 g, the surface-functionalized silica of 81.6 g obtained by Preparation Example 2 was put thereinto, followed by pre-distribution at 2000 rpm for 30 minutes using a homo-mixer and distribution for 1 hour using a beads mill. After bisphenol A type epoxy resin YD-011 (manufactured by Kukdo Chemical Co., Ltd.) of 26 g, a curing agent 2-ethyl-4-methylimidazole of 0.2 g, an acrylic resin Kayarad DPHA (manufactured by Nippon Kayaku Co., Ltd) of 7.6 g, a photoinitiator Irgacure 819 (manufactured by BASF Corporation) of 1.8 g, a photoinitiator Irgacure 184D (manufactured by BASF Corporation) of 1 g were dissolved into the dispersion composition to prepare a resin varnish, the resin varnish was coated on a polyethyleneterephthalate film having a thickness of about 38 μm using a bar coater and dried for about 10 minutes so that the resin had a thickness of about 30 μm after drying, thereby obtaining an insulating film.

Example 2

A resin varnish was prepared by the same method as in Example 1 above except for using a biphenyl type acid-modified epoxy acrylate resin ZCR-1642H (Nippon Kayaku Co., Ltd) instead of using the cresol novolac type acid-modified epoxy acrylate resin of Example 1. Then, the prepared resin varnish was coated on a polyethyleneterephthalate film having a thickness of about 38 μm using a bar coater and dried for about 10 minutes so that the resin had a thickness of about 30 μm after drying, thereby obtaining an insulating film.

Example 3

A resin varnish was prepared by the same method as in Example 1 above except for using a bisphenol A type acid-modified epoxy acrylate resin ZAR-1494H (Nippon Kayaku Co., Ltd) instead of using the cresol novolac type acid-modified epoxy acrylate resin of Example 1. Then, the prepared resin varnish was coated on a polyethyleneterephthalate film having a thickness of about 38 μm using a bar coater and dried for about 10 minutes so that the resin had a thickness of about 30 μm after drying, thereby obtaining an insulating film.

Example 4

A resin varnish was prepared by the same method as Example 1 above except for using a bisphenol F type acid-modified epoxy acrylate resin ZFR-1491H (Nippon Kayaku Co., Ltd) instead of using the cresol novolac type acid-modified epoxy acrylate resin of Example 1. Then, the prepared resin varnish was coated on a polyethylene-terephthalate film having a thickness of about 38 μm using a bar coater and dried for about 10 minutes so that the resin had a thickness of about 30 μm after drying, thereby obtaining an insulating film.

Example 5

A resin varnish was prepared by the same method as Example 1 above except for using a phenol novolac type acid-modified epoxy acrylate resin PCR-1222H (Nippon Kayaku Co., Ltd) instead of using the cresol novolac type acid-modified epoxy acrylate resin of Example 1. Then, the prepared resin varnish was coated on a polyethylene-terephthalate film having a thickness of about 38 μm using a bar coater and dried for about 10 minutes so that the resin had a thickness of about 30 μm after drying, thereby obtaining an insulating film.

Example 6

A resin varnish was prepared by the same method as Example 1 above except for using a triphenolmethane-type acid-modified epoxy acrylate resin TCR-1348H (Nippon Kayaku Co., Ltd) instead of using the cresol novolac type acid-modified epoxy acrylate resin of Example 1. Then, the prepared resin varnish was coated on a polyethylene-terephthalate film having a thickness of about 38 μm using a bar coater and dried for about 10 minutes so that the resin had a thickness of about 30 μm after drying, thereby obtaining an insulating film.

Example 7

A resin varnish was prepared by the same method as Example 1 above except for using a urethane acrylic acid-modified epoxy acrylate resin UXE-3002 (Nippon Kayaku Co., Ltd) instead of using the cresol novolac type acid-modified epoxy acrylate resin of Example 1. Then, the prepared resin varnish was coated on a polyethylene-terephthalate film having a thickness of about 38 μm using a bar coater and dried for about 10 minutes so that the resin had a thickness of about 30 μm after drying, thereby obtaining an insulating film.

Comparative Example 1

A resin varnish was prepared by the same method as Example 1 above except for using a spherical silica slurry (an average particle size: 0.3 μm, 65%, solvent: MEK) instead of using the surface-functionalized silica of Example 1. Then, the prepared resin varnish was coated on a polyethyleneterephthalate film having a thickness of about 38 μm using a bar coater and dried for about 10 minutes so that the resin had a thickness of about 30 μm after drying, thereby obtaining an insulating film.

Example 8

Laminate Comprised of Insulating Film

The insulating films obtained by Example 1 and Comparative Example 1 above was subject to vacuum suction at 80° C. for 20 seconds on an end surface of a surface-treated inner layer circuit board (a conductor thickness: 18 μm, thickness: 0.8 mm) using a vacuum pressing laminater (manufactured by MEIKI Co., Ltd.), and pressing under conditions of about 80° C. and a pressure of about 7.5 kg/cm$^2$ for about 20 seconds to be laminated.

Example 9

Formation of Via Hole

In the laminated insulating film obtained by Example 8, a via hole pattern was exposed in an optimal exposure amount using a Mask Aligner "MDA 12000" exposure system (manufactured by Midas Corporation), and developed with 2.38% TMAH aqueous solution at 25° C. under conditions of spray pressure of 0.2 MPa for 20 seconds to obtain the via hole pattern, followed by performing an ultraviolet irradiation under conditions of integrated-exposure amount of 1500 mJ/cm$^2$ in an UV conveyor, and then a curing process at 180° C. for 60 minutes, thereby obtaining a printed circuit board having the processed via hole.

Figure 5:
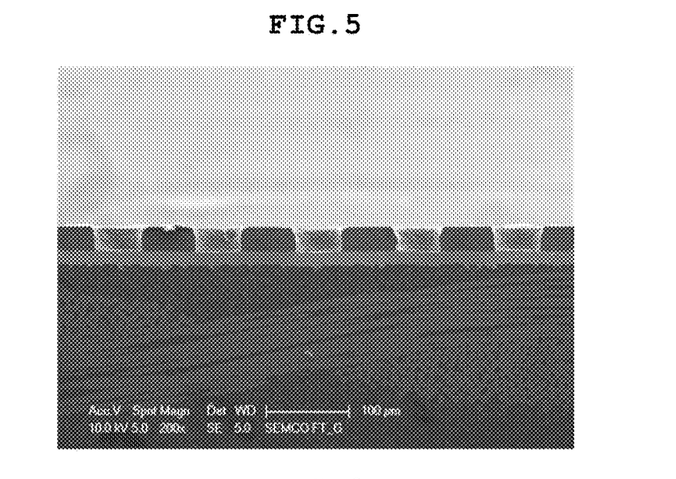
FIGS. 5 and 6 are SEM photographs showing a via hole pattern shape of the printed circuit board manufactured by using an insulating film obtained by Example 7 discussed below, which is an embodiment of the present invention.
Figure 6:
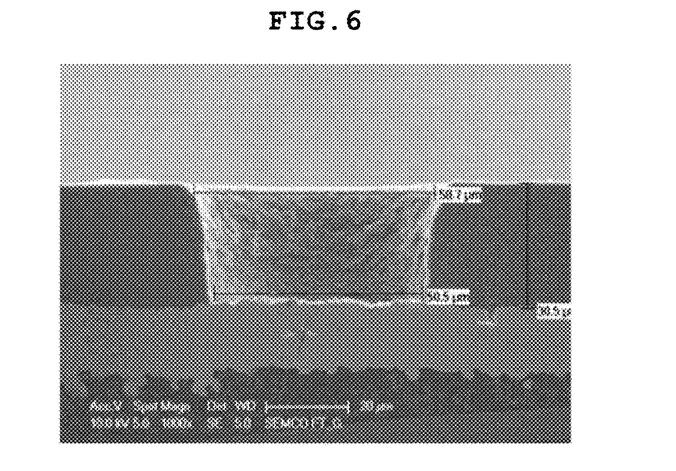

In particular, SEM photographs showing a via hole pattern shape of the printed circuit board obtained from the insulating film according to Example 1 were shown in FIGS. 5 and 6.

Evaluation of Adhesion Strength of Insulating Film

The PET protecting film was peeled off from the laminated insulating film obtained by Example 8, and subjected to ultraviolet irradiation under conditions of integrated-exposure amount of 1500 mJ/cm$^2$ in an UV conveyor, followed by curing at about 180° C. for 60 minutes, thereby obtaining a laminated plate having an insulating layer formed therein on the cross-section of the inner layer circuit layer. The obtained laminated plate was surface-treated by permanganate solution to have surface roughness. In the surface-treatment, the laminated plate was immersed into a swelling treatment solution (Swelling Dip Securiganth P prepared by Atotech Japan Inc.) at about 60° C. for about 10 minutes, and then immersed into an oxidation treatment solution (a mixture of Concentrate Compact (CP) and Dosing Solution Securiganth P prepared by Atotech Japan Inc.) at about 80° C. for about 20 minutes. Then, the reactant was immersed into a reduction treatment solution (Reduction Solution Securiganth P500 prepared by Atotech Japan Inc.) at about 40° C. for about 5 minutes. After a palladium catalyst was added on a surface of the insulating layer of the surface-treated laminated plate, an electroless plating was performed by using a print guns MSK-DK containing tartrate, prepared by Atotech Japan Inc, and an electroplating was performed so that a copper had a thickness of about 20 μm using copper sulfate. The sample in which the electroplating was completed was finally cured at about 170° C. for about 50 minutes.

The conductor layer formed by the electroplating was cut to have a width of 10 mm and a length of 100 mm, and adhesion strength thereof was evaluated under conditions of a rate of 50.8 mm/min and a length of 30 mm using Z050 UTM (Universal testing machine manufactured by Zwick corporation). Results thereof were shown in the following Table 1.

TABLE 1

| Classification | Adhesion Strength (kg f/cm) |
| --- | --- |
| Comparative Example 1 | 0.30 |
| Example 1 | 0.54 |
| Example 2 | 0.48 |
| Example 3 | 0.40 |
| Example 4 | 0.44 |
| Example 5 | 0.38 |
| Example 6 | 0.44 |
| Example 7 | 0.40 |

As shown in Table 1 above, the insulating films (Examples 1 to 7) according to the embodiment of the present invention have remarkably excellent adhesion strength as compared to the insulating film (Comparative Example 1) according to the prior art.

According to the embodiment of the present invention, the negative type photosensitive resin composition capable of having excellent adhesion with the metal and performing an alkali development process may be provided by introducing the surface-functionalized silica by the alkyl sulfonated tetrazole compound into the resin composition.

With the insulating film containing the resin composition according to the embodiment of the present invention, heat-resistance and mechanical properties may be excellent, the via hole may be formed by the exposure and development processes, and adhesion with the metal may be excellent.

In addition, with the printed circuit board including the insulating layer containing the resin composition according to the embodiment of the present invention, the adhesion, the heat-resistance, and the mechanical properties may be maintained to provide excellent reliability, and the via hole may be formed by the exposure and development processes.

Further, with the method of manufacturing the printed circuit board according to the embodiment of the present invention, the via hole may be formed by the exposure and development processes, such that the manufacturing process may be simple and the cost thereof may be reduced as compared to the existing technology.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention. The scope of the invention are defined by the accompanying claims and their equivalents.

What is claimed is:

1. A resin composition comprising:
    a photopolymerizable compound having a polymerizable ethylenically unsaturated bond in a molecule;
    a photoinitiator; and
    a silica surface-functionalized with an alkyl sulfonated tetrazole compound represented by:

where R1 is selected from the group consisting of a C1-C20 aliphatic alkyl group, a C3-C20 alicyclic alkyl group, a C6-C20 aryl group, and a C7-C20 aralkyl group, and
wherein n is an integer of 1 to 6.

2. The resin composition as set forth in claim 1, wherein the photopolymerizable compound is an acid-modified epoxy acrylate resin.

3. The resin composition as set forth in claim 2, wherein the acid-modified epoxy acrylate resin is selected from a group consisting of a cresol novolac type acid-modified epoxy acrylate resin, a biphenyl type acid-modified epoxy acrylate resin, a bisphenol A type acid-modified epoxy acrylate resin, a bisphenol F type acid-modified epoxy acrylate resin, a phenol novolac type acid-modified epoxy acrylate resin, a triphenolmethane-type acid-modified epoxy acrylate resin, an urethane acrylic acid-modified epoxy acrylate resin, and combinations thereof.

4. The resin composition as set forth in claim 2, wherein the acid-modified epoxy acrylate resin has an acid value of about 10 mg KOH/g to about 200 mg KOH/g.

5. The resin composition as set forth in claim 1, wherein the photoinitiator is selected from a group consisting of chloroacetophenone, diethoxy acetophenone, hydroxy acetophenone, .alpha.-amino acetophenone, benzoin ether, benzyl dimethyl ketal, benzo phenone, thioxantone, anthraquinone, and combinations thereof.

6. The resin composition as set forth in claim 1, wherein the silica has an average particle size of about 0.05 μm to about 5 μm.

7. The resin composition as set forth in claim 1, further comprising:
    an epoxy resin, an acrylate resin, and
    a curing agent.

8. The resin composition as set forth in claim 7, wherein the epoxy resin is selected from a group consisting of a bisphenol A type epoxy resin, a bisphenol F type epoxy resin, a bisphenol S type epoxy resin, a phenol novolac type epoxy resin, a cresol novolac type epoxy resin, an alkylphenol novolac type epoxy resin, a biphenyl type epoxy resin, an aralkyl type epoxy resin, a dicyclopentadiene type epoxy resin, a naphthalene type epoxy resin, a naphthol type epoxy resin, a biphenyl aralkyl type epoxy resin, a fluorene type epoxy resin, a xanthene type epoxy resin, a rubber modified type epoxy resin, a phosphorus-based epoxy resin, and combinations thereof.

9. The resin composition as set forth in claim 7, wherein the acrylate resin is selected from a group consisting of EO- or PO-modified(meth)acrylate, triethylene glycol diacrylate, neopentyl glycol diacrylate, 1,6-hexanediol diacrylate, 3-methyl-1,5-pentanediol diacrylate, 2-butyl-2-ethyl-1,3-propanediol diacrylate, 1,9-nonanediol diacrylate, polyethylene glycol diacrylate, 2-hydroxyethyl methacrylate (HEMA), 2-hydroxypropyl methacrylate, 2-hydroxy acrylate, 2-hydroxypropyl acrylate, 2-hydroxybutyl methacrylate, phenyl glycidyl ester acrylate, 1,6-hexanediol epoxy acrylate, glycidyl(meth)acrylate, pentaerythritol tri(meth)acrylate, pentaerythritol tetra(meth)acrylate, ethylene glycol di(meth)acrylate, polyethylene glycol di(meth)acrylate, and combinations thereof.

10. The resin composition as set forth in claim 7, wherein the curing agent is selected from a group consisting of an amide-based curing agent, a polyamine-based curing agent, an acid anhydride curing agent, a phenol novolac-type curing agent, polymercaptan curing agent, a tertiary amine curing agent, an imidazole curing agent, a peroxide curing agent, and combinations thereof.

11. The resin composition as set forth in claim 1, wherein the resin composition includes the photopolymerizable compound in a content of about 10 wt % to about 90 wt %, the photoinitiator in a content of about 0.1 wt % to about 3 wt %, and the silica in a content of about 7 wt % to about 87 wt %.

12. The resin composition as set forth in claim 7, wherein the resin composition includes the epoxy resin in a content of about 1 wt % to about 60 wt %, the acrylate resin in a content of about 1 wt % to about 20 wt %, and the curing agent in a content of about 0.1 wt % to about 3 wt %.

13. An insulating film comprising the resin composition as set forth in claim 1.

14. A printed circuit board comprising an insulating film containing the resin composition as set forth in claim 1.

15. A method of manufacturing a printed circuit board, the method comprising:
    laminating the resin composition as set forth in claim 1 onto a substrate to form an insulating layer comprised of the resin composition; and
    forming a via hole in the insulating layer through exposure and development processes.

16. The method as set forth in claim 15, wherein the development process is performed by using an alkali development solution.

17. The method as set forth in claim 15, wherein the via hole is formed by removing a portion of the insulating layer that is not exposed during the development process.

18. The method as set forth in claim 15, wherein the forming of the insulating layer is performed by coating the resin composition as set forth in claim 1 onto the substrate.

19. The method as set forth in claim 15, wherein the forming of the insulating layer is performed by laminating an insulating film containing the resin composition on the substrate.

20. The method as set forth in claim 15, further comprising:
    after the forming of the via hole, forming a circuit layer including a via in the via hole.

21. A resin composition comprising:
    a photopolymerizable compound;
    a photoinitiator; and
    a silica surface-functionalized with an alkyl sulfonated tetrazole compound represented by:

where R1 is selected from the group consisting of a C1-C20 aliphatic alkyl group, a C3-C20 alicyclic alkyl group, a C6-C20 aryl group, and a C7-C20 aralkyl group, and wherein n is an integer of 1 to 6.

22. A resin that is the resin composition of claim 21 having been photopolymerized.

23. A printed circuit board comprising an insulating film containing the resin A composition as set forth in claim 21.

24. The printed circuit board as set forth in claim 23, wherein a via hole is formed in the insulating film, and the printed circuit board further comprising:
    a substrate on which the insulating film is formed; and
    a metal layer on and in contact with the insulating film.

* * * * *